United States Patent
Read et al.

(10) Patent No.: US 10,434,537 B2
(45) Date of Patent: Oct. 8, 2019

(54) ROTATION OF AN ARRAY OF DISPENSING PUMPS TO ENABLE SIMULTANEOUS DISPENSING WITH MULTIPLE DISPENSING PUMPS ON MULTIPLE ELECTRONIC SUBSTRATES

(71) Applicant: Illinois Tool Works Inc., Glenview, IL (US)

(72) Inventors: Hugh R. Read, Amesbury, MA (US); Thomas C. Prentice, Westford, MA (US); Scott A. Reid, Bradford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/710,498

(22) Filed: Sep. 20, 2017

(65) Prior Publication Data

US 2019/0083998 A1    Mar. 21, 2019

(51) Int. Cl.
*B05C 5/02* (2006.01)
*B05B 11/00* (2006.01)
*G05D 3/20* (2006.01)
*H05K 13/04* (2006.01)

(52) U.S. Cl.
CPC ........ *B05C 5/0233* (2013.01); *B05B 11/3043* (2013.01); *G05D 3/20* (2013.01); *H05K 13/0469* (2013.01)

(58) Field of Classification Search
USPC ........ 118/300, 313–315, 712, 713, 679–683, 118/305, 319–323
See application file for complete search history.

(56) References Cited

U.S. PATENT DOCUMENTS

| | | | |
|---|---|---|---|
| 7,833,572 B2 | 11/2010 | Read | |
| 7,861,650 B2 | 1/2011 | Klauser et al. | |
| 7,923,056 B2 | 4/2011 | Read | |
| 8,230,805 B2 | 7/2012 | Read | |
| 9,374,905 B2 | 6/2016 | Reid et al. | |
| 2007/0009650 A1 | 1/2007 | Cho et al. | |

(Continued)

FOREIGN PATENT DOCUMENTS

| | | |
|---|---|---|
| JP | 2006346593 A | 12/2006 |
| JP | 2007178964 A | 7/2007 |

OTHER PUBLICATIONS

Notification of Transmittal of the International Search Report and the Written Opinion of the International Searching Authority from corresponding PCT/US2018/045993 dated Oct. 26, 2018.

*Primary Examiner* — Yewebdar T Tadesse
(74) *Attorney, Agent, or Firm* — Lando & Anastasi, LLP (57) ABSTRACT

A method of dispensing material includes delivering an electronic substrate to a dispense position. The electronic substrate has at least two identical patterns and at least two fiducial marks. The method further includes capturing at least one image of the at least two fiducial marks provided on the electronic substrate, analyzing the at least one image to determine a position of the electronic substrate in X axis, Y axis and theta directions, calculating a rotational angle of the electronic substrate, and rotating a dispensing pump array to match an angle of the electronic substrate. Alternatively, the electronic substrate can be rotated to match an angle of the dispensing pump array.

4 Claims, 4 Drawing Sheets

(56) References Cited

U.S. PATENT DOCUMENTS

| | | | |
|---|---|---|---|
| 2010/0103214 A1* | 4/2010 | Seo | B41J 2/2135 347/14 |
| 2013/0136850 A1* | 5/2013 | Doyle | C23C 24/02 427/8 |
| 2016/0008835 A1 | 1/2016 | Giusti et al. | |
| 2016/0038957 A1* | 2/2016 | Prentice | B05C 11/1047 427/8 |

* cited by examiner

ROTATION OF AN ARRAY OF DISPENSING PUMPS TO ENABLE SIMULTANEOUS DISPENSING WITH MULTIPLE DISPENSING PUMPS ON MULTIPLE ELECTRONIC SUBSTRATES

BACKGROUND OF THE DISCLOSURE

1. Field of the Disclosure

This disclosure relates generally to apparatus and methods for dispensing a viscous material on a substrate, such as a printed circuit board, and more particularly to a method and an apparatus for simultaneously dispensing material on one or more substrates with enhanced efficiency and accuracy.

2. Discussion of Related Art

There are several types of dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto printed circuit boards. Automated dispensing systems are also used for dispensing lines of underfill materials and encapsulants, which may be used to mechanically secure components to the printed circuit board. Exemplary dispensing systems described above include those manufactured and distributed by Illinois Tool Works Electronic Assembly Equipment (ITWEAE), with offices at Hopkinton, Mass.

In a typical dispensing system, a dispensing pump is mounted to a moving assembly or gantry for moving the dispensing pump along three mutually orthogonal axes (X axis, Y axis, and Z axis) using servomotors controlled by a computer system or controller. To dispense a dot of liquid on a printed circuit board or other substrate at a desired location, the dispensing pump is moved along the co-planar horizontal X axis and Y axis directions until the dispensing pump is located over the desired location. The dispensing pump is then lowered along the perpendicularly oriented vertical Z axis direction until a nozzle/needle of the dispensing pump and dispensing system is at an appropriate dispensing height over the substrate. The dispensing pump dispenses a dot of liquid, is then raised along the Z axis, moved along the X and Y axes to a new location, and is lowered along the Z axis to dispense the next liquid dot. For applications such as encapsulation or dispensing of underfill as described above, the dispensing pump is typically controlled to dispense lines of material as the dispensing pump is moved in the X and Y axes along the desired path of the lines. For some types of dispensing pumps, such as jetting pumps, the Z axis movement prior to and subsequent to a dispense operation may not be required.

The production rate of such dispensing systems, in some cases, may be limited by the rate at which a particular dispensing pump can accurately and controllably dispense dots or lines of material. In other cases, the production rate of such systems may be limited by the rate at which parts can be loaded into and out of the machine. In still other cases, the production rate of such systems may be limited by process requirements, such as the time required to heat a substrate to a particular temperature, or the time required for a dispensed material to flow, as in underfill applications.

During the manufacture of electronic circuit assemblies, sometimes referred to as printed circuit board assemblies, production requirements often exceed the throughput capabilities of a single dispensing system. To overcome the throughput limitations of a single dispensing system, various strategies are applied to improve the production process, often by enabling multiple operations to be performed in parallel. For example, U.S. Pat. Nos. 7,833,572, 7,923,056, 8,230,805 and 9,374,905, which are incorporated herein by reference in their entirety for all purposes, are each directed to systems and or methods for simultaneously dispensing material with a dispensing system having multiple dispensing units. The systems and methods disclosed in these patents teach adjusting a spacing between adjacent dispensing units by using an adjustable bracket or by controlling the relative X-Y position of one dispensing pump relative to another either prior to or during dispensing operations. Such systems are versatile and can be well suited to a variety of dispensing applications. However, the mechanical and electrical complexities of such systems may be impractical or costly when applied to three or more dispensing pumps.

In the production of electronic assemblies for markets such as high-volume consumer goods, electronic circuit boards are often fabricated with multiple instances of a particular circuit present on one circuit board. A single printed circuit panel might, for example, have four identical circuit patterns displaced at uniform intervals. The repeating pattern of multiple circuits lends itself well to simultaneous dispensing on two or more circuits at once. Depending on the distance between patterns, it may be impractical to place two dispensing pumps close enough to dispense on adjacent circuits, such as dispensing first on circuits #1 & #2, then #3 & #4. However, the same advantage can be realized by dispensing first on #1 & #3, then on #2 & #4. It will be observed, however, that any rotation of the substrate in the X-Y plane will result in a change in the relative X-Y location of the two patterns being dispensed. As such, the relative spacing between the two (or more) dispensing pumps must be adjusted to match the spacing of the substrate if two or more patterns are to be dispensed simultaneously and accurately. Alternatively, the substrate can be rotated to match the array of dispensing pumps.

It is a goal of the present disclosure to facilitate the parallel dispensing operations of multiple dispensing pumps in a scalable and practical manner.

SUMMARY OF THE DISCLOSURE

One aspect of the disclosure is directed to a method of dispensing material comprising: delivering an electronic substrate to a dispense position, the electronic substrate having at least two identical patterns and at least two fiducial marks; capturing at least one image of the at least two fiducial marks provided on the electronic substrate; analyzing the at least one image to determine a position of the electronic substrate in X axis, Y axis and theta directions; calculating a rotational angle of the electronic substrate; and rotating a dispensing pump array to match an angle of the electronic substrate.

Embodiments of the method further may include performing a simultaneous dispense operation on the at least two identical patterns with the dispensing pump array. The dispensing pump array may include a first dispensing pump and a second dispensing pump, the second dispensing pump being spaced from the first dispensing pump a predetermined distance. The method further may include dispensing material from the first and second dispensing pumps on respective first locations of a first pattern and a second pattern of the at least two identical patterns. The method further may include simultaneously moving the first dispensing pump over a second location of the first pattern and the second dispensing pump over a second location of the second pattern of the electronic substrate, and dispensing material from the first and second dispensing pumps on respective second locations of the first and second patterns. Dispensing material from the first dispensing pump may include lowering the first dispensing pump toward a first pattern of the at least two identical patterns, and dispensing material from the second dispensing pump may include lowering the second dispensing pump toward a second pattern of the at least two identical patterns. Rotating the dispensing pump array may include adjusting the second dispensing pump with an X-Y adjustment mechanism. The dispensing pump array may be aligned to the electronic substrate with a single rotational degree of freedom, and for a dispensing system including multiple electronic substrates and multiple dispensing pump arrays, each dispensing pump array may be aligned to its corresponding electronic substrate. When multiple dispensing pump arrays are used, each dispensing pump array may be rotated at a different angle with the other dispensing pump arrays to match target electronic substrates. Each dispensing pump array may be dynamically moved to adjust a relative spacing between the multiple dispensing pump arrays during dispense operations.

Another aspect of the disclosure is directed to a dispensing system for dispensing viscous material on an electronic substrate. In one embodiment, the dispensing system includes a frame and a support coupled to the frame. The support is configured to receive an electronic substrate. The electronic substrate has at least two identical patterns and at least two fiducial marks. The dispensing system further includes a dispensing pump array configured to dispense viscous material, a gantry coupled to the frame, the gantry being configured to move the dispensing pump array in X axis and Y axis directions, and to rotate the dispensing pump array, and a vision system coupled to one of the frame and the gantry to capture at least one image of the at least two fiducial marks provided on the electronic substrate. The dispensing system further includes a controller configured to control the dispensing pump array, the gantry and the vision system to perform a dispense operation on the electronic substrate. The controller further is configured to analyze the at least one image to determine a position of the electronic substrate in X axis, Y axis and theta directions, calculate a rotational angle of the electronic substrate, and rotate a dispensing pump array to match an angle of the electronic substrate.

Embodiments of the dispensing system further may include configuring the controller to perform a simultaneous dispense operation on the at least two identical patterns with the dispensing pump array. The dispensing pump array may include a first dispensing pump and a second dispensing pump, with the second dispensing pump being spaced from the first dispensing pump a predetermined distance. The controller further may be configured to dispense material from the first and second dispensing pumps on respective first locations of a first pattern and a second pattern of the at least two identical patterns. The dispensing system further may include simultaneously moving the first dispensing pump over a second location of the first pattern and the second dispensing pump over a second location of the second pattern of the electronic substrate, and dispensing material from the first and second dispensing pumps on respective second locations of the first and second patterns. Dispensing material from the first dispensing pump may include lowering the first dispensing pump toward a first pattern of the at least two identical patterns, and dispensing material from the second dispensing pump may include lowering the second dispensing pump toward a second pattern of the at least two identical patterns. Rotating the dispensing pump array may include adjusting the second dispensing pump with an X-Y adjustment mechanism. The dispensing pump array may be aligned to the electronic substrate with a single rotational degree of freedom, and for a dispensing system including multiple electronic substrates and multiple dispensing pump arrays, each dispensing pump array may be aligned to its corresponding electronic substrate. When multiple dispensing pump arrays are used, each dispensing pump array may be rotated at a different angle with the other dispensing pump arrays to match target electronic substrates. Each dispensing pump array may be dynamically moved to adjust a relative spacing between the multiple dispensing pump arrays during dispense operations.

Yet another aspect of the disclosure is directed to a method of dispensing material comprising: delivering an electronic substrate to a dispense position, the electronic substrate having at least two identical patterns and at least two fiducial marks; capturing at least one image of the at least two fiducial marks provided on the electronic substrate; analyzing the at least one image to determine a position of the electronic substrate in X axis, Y axis and theta directions; calculating a rotational angle of the electronic substrate; and rotating the electronic substrate to match an angle of a dispensing pump array.

Embodiments of the method further may include performing a simultaneous dispense operation on the at least two identical patterns with the dispensing pump array. The dispensing pump array may include a first dispensing pump and a second dispensing pump, with the second dispensing pump being spaced from the first dispensing pump a predetermined distance. The method further may include dispensing material from the first and second dispensing pumps on respective first locations of a first pattern and a second pattern of the at least two identical patterns. The method further may include simultaneously moving the first dispensing pump over a second location of the first pattern and the second dispensing pump over a second location of the second pattern of the electronic substrate, and dispensing material from the first and second dispensing pumps on respective second locations of the first and second patterns. Dispensing material from the first dispensing pump may include lowering the first dispensing pump toward a first pattern of the at least two identical patterns, and dispensing material from the second dispensing pump may include lowering the second dispensing pump toward a second pattern of the at least two identical patterns. Rotating the electronic substrate may include rotating a base configured to support the electronic substrate. The dispensing pump array may be aligned to the electronic substrate with a single rotational degree of freedom, and for a dispensing system including multiple electronic substrates and multiple dispensing pump arrays, each dispensing pump array may be aligned to its corresponding electronic substrate.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE DISCLOSURE

Various embodiments of the present disclosure are directed to viscous material dispensing systems, devices including dispensing systems. Embodiments disclosed herein are directed to techniques for dispensing material on an electronic substrate by a dispensing system having multiple dispensing pumps that are configured to simultaneously dispense on multiple electronic substrates.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Figure 1:
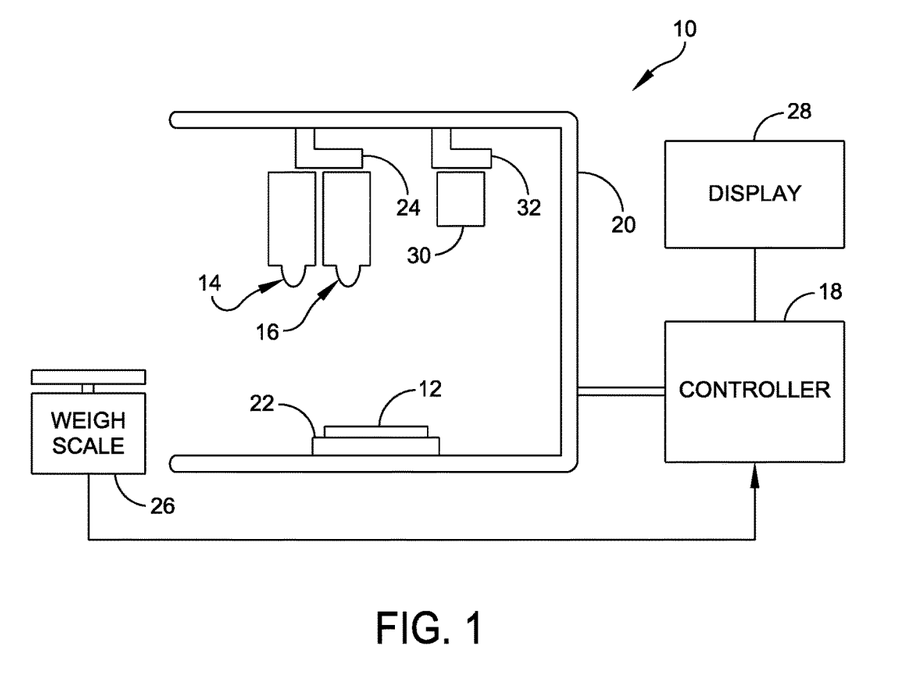
FIG. 1 is a side schematic view of a dispensing system.

FIG. 1 schematically illustrates a dispensing system, generally indicated at 10, according to one embodiment of the present disclosure. The dispensing system 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. The dispensing system 10 includes an array of dispensing units, for example, first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that the array of dispensing units can include more than two dispensing units shown and described throughout the disclosure.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a Z axis sensor to detect a height at which the dispensing unit is disposed above the electronic substrate 12 or above a feature mounted on the electronic substrate. The Z axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the dispensing unit gantry 24. As described, the vision system 30 is employed to verify the location of landmarks, known as fiducials, or components on the electronic substrate. Once located, the controller can be programmed to manipulate the movement of one or more of the dispensing units 14, 16 to dispense material on the electronic substrate.

Systems and methods of the present disclosure are directed to dispensing material onto an electronic substrate, e.g., a printed circuit board. The description of the systems and methods provided herein reference exemplary electronic substrates 12 (e.g., printed circuit boards), which are supported on the support 22 of the dispensing system 10. In one embodiment, the dispense operation is controlled by the controller 18, which may include a computer system configured to control material dispensing units. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Embodiments of the present disclosure offer alternative and competitive means to accurately dispense simultaneously on one or more electronic substrates or two or more patterns associated with a single electronic substrate. The methods disclosed herein further support the use of various types of dispensing pumps, including, but not limited to, auger, piston and jetting pumps.

In one embodiment, an array of two or more dispensing pumps is mounted to a common bracket or support assembly to form an assembled array of dispensing pumps, hereinafter referred to as a dispensing pump array or a pump array. The relative spacing between individual dispensing pumps of the dispensing pump array is adjusted, either manually or automatically, to match the relative spacing between the substrate patterns to be dispensed upon. The dispensing pump array is attached to a mechanism that is capable of rotating the dispensing pump array in the X-Y plane relative to the X-Y axes of the positioning system. The dispensing pump array may or may not be positioned vertically by a Z axis, which in turn is positioned in an X axis and Y axis position relative to one or more electronic substrates by a gantry drive system.

Systems constructed and arranged in accordance with embodiments of the present disclosure may be configured to use two or more theta-driven pump arrays on a common gantry drive system. When two pump arrays are used on one dispense system, an X-Y adjustment mechanism may be used to adjust the relative spacing between the two pump arrays. If more than two pump arrays are utilized on one system, then multiple X-Y adjustment mechanisms may be used to adjust the relative spacing between the pump arrays.

Prior to production operation of a dispensing system, certain setup steps should be performed. For example, referring to FIG. 2, a dispensing pump array, generally indicated at 40, is shown to have two dispensing pumps, indicated at 42 and 44. Also an electronic substrate, generally indicated at 46, includes four identical patterns 48A ("Pattern 1"), 48B ("Pattern 2"), 48C ("Pattern 3") and 48D ("Pattern 4"), each pattern having a known point A and a known point B. The electronic substrate 46 further includes a first fiducial mark F1, a second fiducial mark F2 and a third fiducial mark F3. A method of performing simultaneous dispensing on the electronic substrate 46 includes determining a spacing interval or pitch between each of the four patterns 48A, 48B, 48C and 48D. This pitch may be measured from a sample electronic substrate, or the data may be known from design data.

Figure 2:
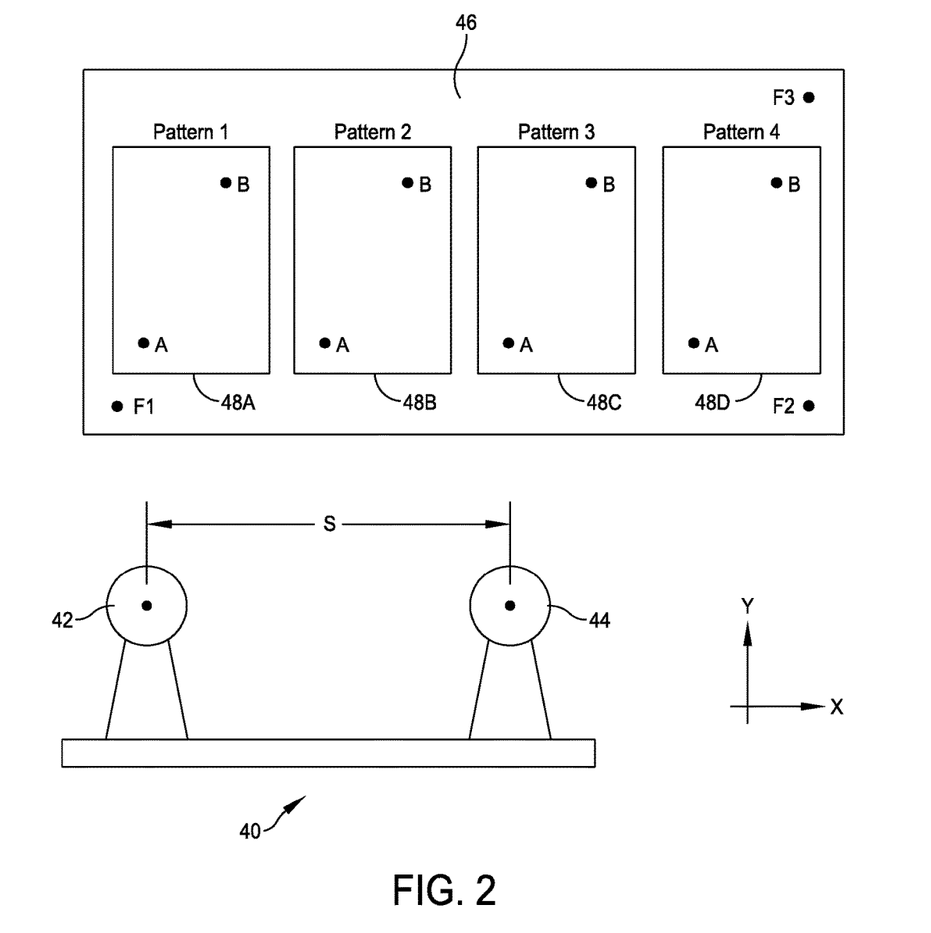
FIGS. 2 and 3 are schematic views of a dispensing system of an embodiment of the disclosure used to perform methods of the disclosure.

For example, in the shown embodiment, the pitch can be measured from the known points A, B on the patterns 48A, 48B, 48C and 48D of the electronic substrate 46. Specifically, the pitch can be measured between the known points A-A or the known points B-B between adjacent patterns on the substrate 46, e.g., between patterns 48A and 48B. The latter of these two methods of determining pitch is often preferable, as the design data may be more accurate than measurements taken from the particular electronic substrate that may have its own particular variations from an ideal or perfect electronic substrate. Once the pattern pitch is known, a spacing S between the dispensing pumps 42, 44 of the dispensing pump array 40 is adjusted accordingly to achieve a predetermined distance. In this example, the dispensing pump spacing S has been adjusted to twice the pattern pitch.

This arrangement may be more practical to attain than setting the dispensing pump spacing S to one pattern pitch interval, particularly if the pattern pitch is close to or less than a width of a dispensing pump. The process of adjusting the pump-to-pump spacing S may be accomplished either manually or automatically, and may include calibration of the actual dispense position of each dispensing pump 42, 44 relative to a machine vision system, such as vision system 30, sometime referred to as "teaching a camera-to-nozzle offset."

Additional setup steps include creating a program or process recipe that specifies the amount and location of material to be dispensed on each pattern 48A, 48B, 48C and 48D of the electronic substrate 46. The information for generating this process recipe may be determined from design data or it may be "taught" from a particular electronic substrate. The process recipe further may include instructions for alignment sensing and calibration (e.g., when and where to perform "Z-sense" calibration of the surface height), weight calibration (e.g., how and when to monitor and calibrate the output of the dispensing pump), temperature control (e.g., wait until the electronic substrate has been in the heat zone for 20 seconds before commencing dispensing), timing of the dispense operations (e.g., wait 30 seconds after this deposit before doing that deposit), etc.

Once the machine (dispensing system) and program setup steps are complete, production operation of the machine may commence as follows. An electronic substrate is loaded into position in the dispense system. Typical mechanisms for loading electronic substrates include, but are not limited to, conveyor systems that may use one or more conveyor lanes.

Figure 3:
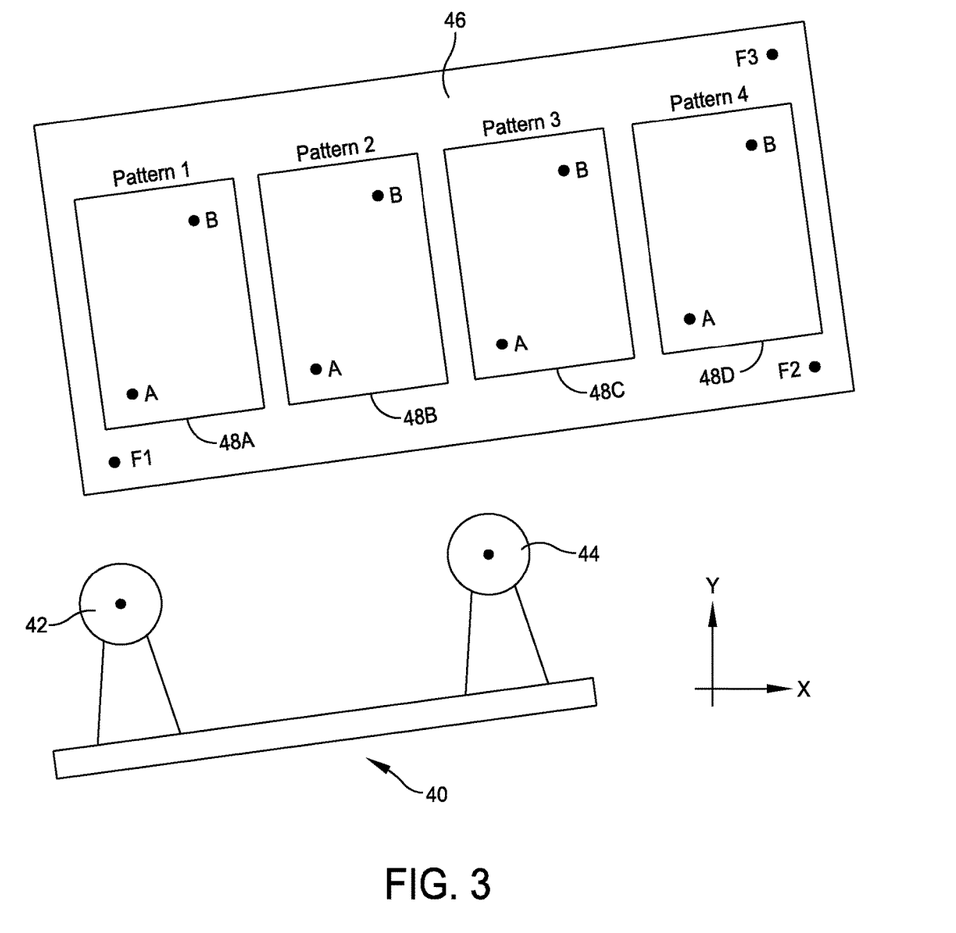

Referring now to FIG. 3, a machine vision system, e.g., vision system 30 shown in FIG. 1, is used to locate the electronic substrate 46, typically accomplished by capturing images of alignment features, such as the fiducial marks F1, F2 and F3, and then analyzing the images to determine the position (in X-Y and theta) of the electronic substrate. Once the rotational angle of the electronic substrate 46 is calculated, the dispensing pump array 40 is then rotated in theta to match the angle of the electronic substrate. In other words the alignment of the first dispensing pump 42 and the second dispensing pump 44 of the dispensing pump array 40 is aligned or parallel to the alignment of the patterns 48A, 48B, 48C and 48D of the electronic substrate 46. In prior systems, such as the system disclosed in U.S. Pat. No. 9,374,905, the adjustment of second dispensing pump 44 relative to the first dispensing pump 42 is accomplished with an X-Y adjustment mechanism. This approach works well for a system having of two dispensing pumps.

Specifically, in one embodiment, the dispensing unit gantry 24 may be configured to include a beam that extends between two side rails. The beam is configured to move in a Y axis direction along the side rails to achieve Y axis movement of the dispensing pump array 40. X axis movement of the dispensing pump array 40 is achieved by a carriage device mounted on the beam. Specifically, the carriage device supports the dispensing pump array 40 and is configured to move along a width of the beam in the X axis direction to move the dispensing units over desired locations of the substrate 12 positioned on the base 22 of the dispenser 10. In a certain embodiment, movement of the dispensing unit gantry 24 (i.e., movement of the beam and the carriage device) in the X-Y plane may be achieved by employing ball screw mechanisms driven by respective motors or other linear motion drive components as is well known in the art.

The dispensing pump 42 and the dispensing pump 44 are coupled to the carriage device by a linear bearing secured to the carriage device. In one embodiment, the dispensing pump 42 is fixedly secured to the linear bearing and the dispensing pump 44 is coupled to the linear bearing by an automatic adjustment mechanism. It should be understood that the dispensing pump 44 may be fixed to the linear bearing and the dispensing pump 42 may be coupled to the automatic adjustment mechanism, or both dispensing pumps 42, 44 may be coupled to the automatic adjustment mechanism, and fall within the scope of the present disclosure. In a certain embodiment, the dispensing pump 42 and the dispensing pump 44 can be offset from one another a distance, with the automatic adjustment mechanism being configured to adjust the distance by moving the second dispensing unit a relatively small distance in the X axis and Y axis directions. In another embodiment, the mounting assemblies associated with the dispensing pumps 42, 44 are each configured to enable Z axis movement of the dispensing pumps.

Once configured, the controller of the dispensing system (e.g., controller 18 of dispensing system 10) is configured to perform a simultaneous dispense operation on at least two identical patterns of the electronic substrate 46 with the dispensing pumps 42, 44 of the dispensing pump array 40. Specifically, with reference to the arrangement shown in FIG. 3, the dispensing pump array 40 is moved to position the first dispensing pump 42 over the first location A of pattern 48A and to position the second dispensing pump 44 over the first location A of pattern 48C. During a dispense operation, the dispensing pump array 40 is moved to simultaneously position the first dispensing pump 42 over the second location B of pattern 48A and the second dispensing pump 44 over the second location B of pattern 48C, and material is dispensed from the first and second dispensing pumps of the dispensing pump array onto patterns 48A, 48C of the electronic substrate. In some embodiments, during dispensing, the first dispensing pump 42 is lowered toward the pattern 48A and the second dispensing pump 44 is lowered toward the pattern 48C. The lowering of the first dispensing pump 42 and the second dispensing pump 44 of the dispensing pump array 40 can occur simultaneously.

Similarly, to dispense on pattern 48B and pattern 48D of the electronic substrate 46, the dispensing pump array 40 is moved to position the first dispensing pump 42 over the first location A of pattern 48B and to position the second dispensing pump 44 over the first location A of pattern 48D. During a dispense operation, the dispensing pump array 40 is moved to simultaneously position the first dispensing pump 42 over the second location B of pattern 48B and the second dispensing pump 44 over the second location B of pattern 48D, and material is dispensed from the first and second dispensing pumps of the dispensing pump array onto patterns 48B, 48D of the electronic substrate.

Figure 4:
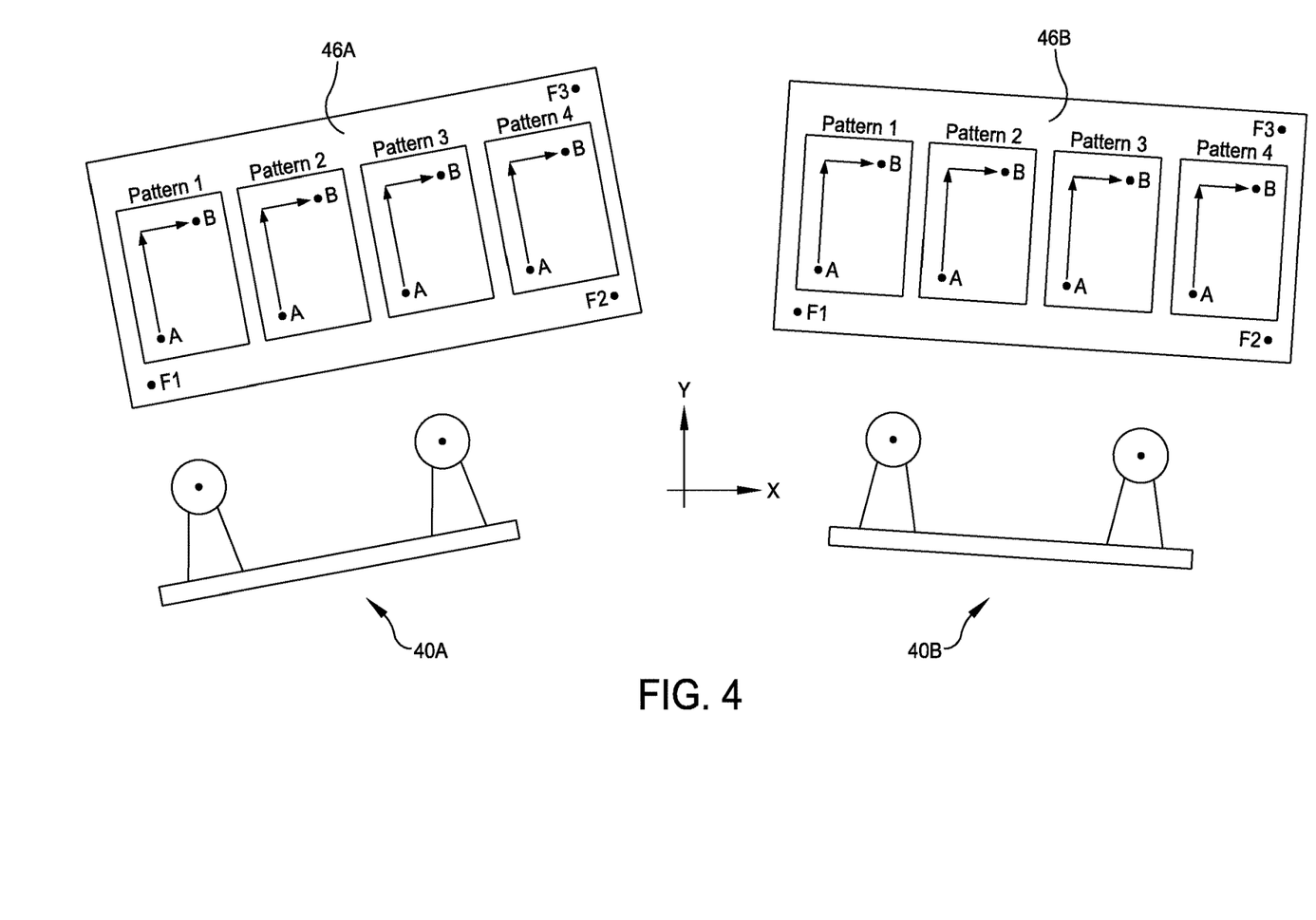
FIG. 4 is a schematic view of a dispensing system of another embodiment of the disclosure used to perform methods of the disclosure.

In the present disclosure, the dispensing pumps 42, 44 of the dispensing pump array 40 are aligned to the electronic substrate 46 with a single rotational degree of freedom. Referring to FIG. 4, for dispensing systems in which multiple electronic substrates 46 and multiple pump arrays 40 are utilized, the same alignment process is used to align each of the pump arrays with each of the corresponding electronic substrates. Where multiple pump arrays 40 are used, each may be rotated at different angles to one another to match the target electronic substrates 46A, 46B, as the electronic substrates could also be orientated at different angles when positioned in the electronic substrate support system. In the case of multiple dispensing pump arrays 40 thus aligned to electronic substrates at different angles, the X-Y adjustment mechanism may be used to dynamically adjust the relative spacing between the dispensing pump arrays during the various dispense operations, as the relative spacing between corresponding features on each of the multiple electronic substrates 46 will vary depending on the locations of the features within the electronic substrate.

As clearly shown in FIG. 4, the dispense paths from A to B on a first electronic substrate 46A are not parallel to the corresponding dispense paths from A to B on a second electronic substrate 46B. The divergence between these two paths dictates that a distance between the two dispensing pump arrays 40A, 40B must be adjusted during the dispense move to ensure that each dispensing pump array remains properly aligned with the desired path on the electronic substrates 46A, 46B.

It should be noted that while rotation angles as shown have been greatly exaggerated for the purposes of clarity, even very small rotation angles on the order of a milliradian (Mrad) or less can result in lateral offsets which left uncorrected, can be detrimental to the dispensing process.

In one embodiment of the present disclosure, a substrate conveyor is configured to load a substrate carrier containing two or more electronic substrates. The two or more electronic substrates may each be at their own angles of rotation, for which separate angular alignment may be required.

In another embodiment of the present disclosure, a substrate conveyor loads and unloads electronic substrates to and from two or more distinct dispense locations. For example, a first electronic substrate is loaded to a first dispense location, and a second electronic substrate is loaded to a second dispense location. The machine vision system is then used to locate each of the two electronic substrates for subsequent dispensing.

In an alternate embodiment of the present disclosure, an electronic substrate may be rotated to be in alignment with the dispensing pump array 40. A significant advantage of this approach is that the theta adjustment mechanism does not need to be carried about by the X-Y motion system as part of the moving payload. Specifically, the base 22 of the dispenser 10 can be manipulated to position the electronic substrate 12 instead of adjusting the positions of the dispensing pumps 42, 44 of the dispensing pump array 40. The dispensing pumps 42, 44 can be fixed with respect to one another, and the base 22 of the dispenser 10 can be configured to move in the X axis and the Y axis directions to rotate and otherwise position the base in a desired position prior to performing a dispensing operation with the dispensing pump array 40. One such mechanism for adjusting a substrate support can be found in U.S. Pat. No. 7,861,650, which is incorporated herein by reference in its entirety for all purposes.

Specifically, in one embodiment, the base 22 includes the table, which functions with a support to support the electronic substrate 12 in a dispense position. The table is configured to move so as to align the electronic substrate 12 disposed on the support with the dispensing pump array 40 by the vision system 30. In one embodiment, the table includes four ball bearings that are adapted to ride on top of machined surfaces provided on top of the frame 20 of the dispenser 10. The dispenser 10 includes three movement mechanisms to move the table so that the electronic substrates 12 are moved into alignment. The movement mechanisms can be identical in construction, in which the first and third movement mechanisms are configured to move the table in the Y axis direction and the second movement mechanism is configured to move the table in the Y axis direction. The first and third movement mechanisms can be spaced apart from one another with the second movement mechanism disposed in between in a direction transverse to the direction of the first and third mechanisms. The arrangement is such that the movement of the table of the base 22 in the X axis and Y axis directions, as well as the rotation of the table, is achieved under the control of the controller 18 by manipulating the movement mechanisms to rotate the base to a desired position.

In another alternate embodiment of the present disclosure, two or more electronic substrates may be independently rotated to be in alignment with the dispensing pump arrays.

Another embodiment further includes an X-Y adjustment mechanism to adjust the spacing between the two or more electronic substrates. By adjusting the two or more electronic substrates relative to each other in rotation and X-Y, a significant advantage may be realized, in that multiple separate electronic substrates may be aligned to and dispensed upon by a single array of dispensing pumps.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A dispensing system for dispensing viscous material on an electronic substrate, the dispensing system comprising:
    a frame;
    a support coupled to the frame, the support being configured to receive a first electronic substrate having at least two identical patterns and at least two fiducial marks and a second electronic substrate having at least two identical patterns and at least two fiducial marks;
    a first dispensing pump array configured to dispense viscous material;
    a second dispensing pump array configured to dispense viscous material, the second dispensing pump array being spaced from the first dispensing pump array a predetermined distance;
    a gantry coupled to the frame, the gantry being configured to move the first dispensing pump array and the second dispensing pump array in X axis and Y axis directions, and to rotate the first dispensing pump array and the second dispensing pump array at different angles with respect to one another;
    a vision system coupled to one of the frame and the gantry to capture at least one image of the at least two fiducial marks provided on the first electronic substrate and the at least two fiducial marks provided on the second electronic substrate; and
    a controller configured to control the first dispensing pump array, the second dispensing pump array, the gantry and the vision system to perform a dispense operation on the first electronic substrate and the second electronic substrate, the controller further being configured to analyze the at least one image to determine a positions of the first electronic substrate the second electronic substrate in X axis, Y axis and theta directions, calculate rotational angles of the first electronic substrate and the second electronic substrate, and rotate the first dispensing pump array to match an angle of the first electronic substrate and the second dispensing pump array to match an angle of the second electronic substrate.

2. The dispensing system of claim 1, the controller further being configured to perform a simultaneous dispense operation on the at least two identical patterns of the first electronic substrate and on the two identical patterns of the second electronic substrate with the first dispensing pump array and the second dispensing pump array, respectively.

3. The dispensing system of claim 2, wherein each of the dispensing pump array and the second dispensing pump array include a first dispensing pump and a second dispensing pump, the second dispensing pump being spaced from the first dispensing pump a predetermined distance.

4. The dispensing system of claim 3, wherein, for each dispensing pump array, the controller further is configured to dispense material from the first and second dispensing pumps on respective first locations of a first pattern and a second pattern of the at least two identical patterns.

* * * * *